United States Patent [19]

Einbinder

[11] Patent Number: 5,075,643

[45] Date of Patent: Dec. 24, 1991

[54] FREQUENCY MODULATOR

[75] Inventor: Stephen B. Einbinder, Plantation, Fla.

[73] Assignee: Motorola, Inc., Schaumburg, Ill.

[21] Appl. No.: 632,565

[22] Filed: Dec. 24, 1990

[51] Int. Cl.$^5$ .......................... H03C 3/00; H03B 5/00
[52] U.S. Cl. ..................................... 332/135; 332/136; 331/117 R; 331/177 R; 331/177 V; 331/185; 455/113
[58] Field of Search ............... 332/102, 113, 127, 128, 332/135, 136; 331/16, 18, 34, 36 C, 108 C, 116 R, 116 FE, 117 R, 117 FE, 177 R, 177 V, 185; 375/65; 455/75, 76, 87, 113, 123, 127

[56] References Cited

U.S. PATENT DOCUMENTS

| | | | |
|---|---|---|---|
| 3,246,258 | 4/1966 | Boreen | 331/177 R |
| 3,509,492 | 4/1970 | Gim Yee Pong et al. | 331/177 R |
| 4,088,968 | 5/1978 | Pradal et al. | 331/177 V X |
| 4,343,219 | 8/1982 | Uetrecht | 331/177 R X |

OTHER PUBLICATIONS

*Modern Communication Circuits*, "7.6 Voltage Controlled Oscillators and Voltage Controlled Crystal Oscillators"; by Jack Smith; pp. 269–270, 1989.

*Primary Examiner*—David Mis
*Attorney, Agent, or Firm*—Daniel K. Nichols

[57] ABSTRACT

An improved frequency modulation apparatus (100) is provided comprising a generator (102), a biasing voltage line (116), and an interface circuit (110). The generator (102) is utilized to generate a carrier signal. A control line input (104) on the generator (102) adjusts the frequency of the carrier signal. The biasing voltage line (116) provides DC power in order to DC bias the generator (102). The interface circuit (110) couples an information signal (114) to the biasing voltage line (116) for altering the biasing of the generator (102) in response to the information signal (114). The alteration of the biasing of the generator (102) results in the carrier signal being frequency modulated by the information signal (114).

15 Claims, 2 Drawing Sheets

FREQUENCY MODULATOR

TECHNICAL FIELD

This invention relates generally to communication devices and particularly to communication devices having frequency modulator voltage controlled oscillators.

BACKGROUND

Frequency modulation is a well known modulation technique in communication devices. In most of today's advanced communication devices frequency modulation is accomplished by modulating the frequency of a voltage controlled oscillator (VCO). This is usually accomplished by varying the resonant frequency of oscillation in a tank circuit which is used to generate a carrier signal. Several methods have been utilized for achieving the modulation. The most common way is the use of a modulating varactor placed in series or in parallel with the tank circuit. The varactor will change its capacitance in proportion to an applied modulation signal resulting in a slight variation in the capacitance of the tank circuit. This change in capacitance causes the oscillator frequency to change in response to the modulation signal, resulting in the frequency modulation of the carrier signal. This technique is highly sensitive and in general tends to degrade the Q of the tank circuit. To alleviate the Q degradation problem, the modulating varactor and its associated components must be added to the high Q substrate used to carry the VCO components. However, the increase in the size of the substrate will considerably add to the cost of the VCO.

An alternative to this technique is the use of the control line as the modulation input port. The problem with this modulation method is that there are poles and zeros introduced in the loop filter which results in poor audio response. Another problem with this technique is its temperature dependent characteristics.

With limitations observed on available modulation techniques, it is clear that a need exits for a modulation technique to be effectively used in communication devices without sacrificing cost, space, or sensitivity.

SUMMARY OF THE INVENTION

Briefly, according to the invention, a frequency modulation apparatus is disclosed. The apparatus comprises a generator means, a biasing means, and an interface means. The generator means is utilized to generate a carrier signal. A control line input on the generator means adjusts the frequency of the carrier signal. The biasing means provides DC power in order to DC bias the generator means. The interface means couples an information signal to the biasing means for altering the biasing of the generator means in response to the information signal. The alteration of the biasing of the generator means results in the carrier signal being frequency modulated by the information signal.

DETAILED DESCRIPTION OF THE PREFERRED EMBODIMENT

Figure 1:
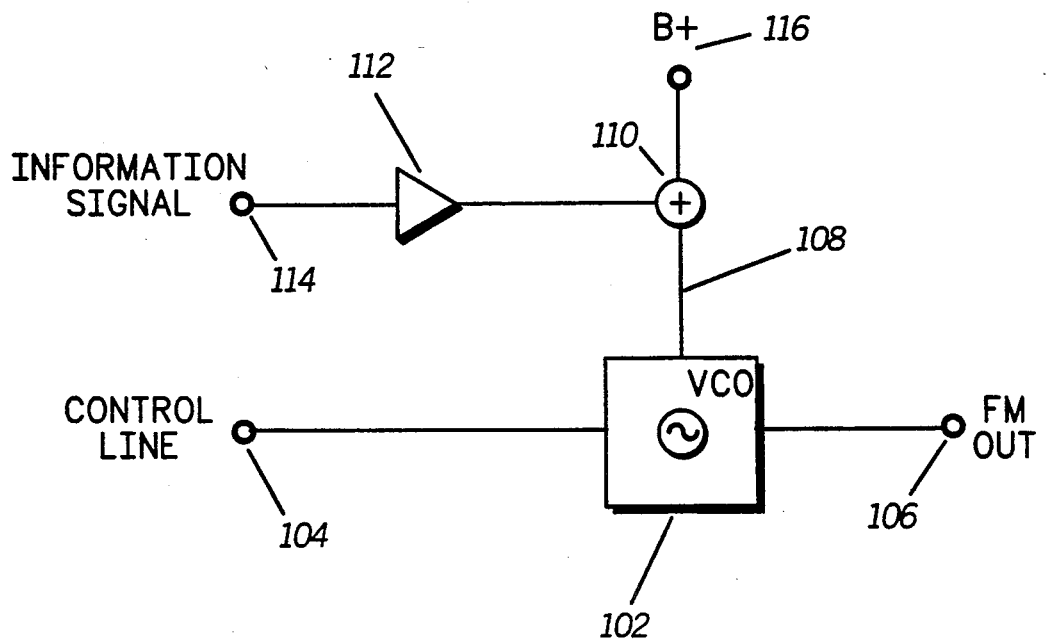
FIG. 1 is a block diagram of a frequency modulation apparatus in accordance with the present invention.

The apparatus 100 is shown to include a voltage controlled oscillator (VCO) 102 that is used to generate a carrier signal. The VCO 102 includes a control line input 104, a power supply input 108, and an output 106. The signal available at the control line input 104 is normally a DC signal which determines the frequency of the carrier signal. The power supply input 108 provides DC power to the VCO 102. The input 108 is coupled to the output of a summer 110 which interfaces an information signal 114 to a B+ line 116. The first input of the summer 110 is connected to the B+ line 116 which is the output of a DC voltage source such as a battery, a voltage regulator, or more generically a power supply. The B+ line 116 provides the biasing means of the apparatus 100. The second input of the summer 110 receives the information signal 114, buffered by a buffer 112. The buffer 112 provides amplification of the information signal 114 and matches the output impedance of the device generating the information signal 114 to the input impedance of the summer 110. Typically, the information signal is a voice or data signal.

The summer 110 may be an operational amplifier functioning as a summer or a bipolar or a field effect transistor. The output signal 108 of the summer 110 is the summation of the information signal 114, which is a time varying signal, and the B+ signal which is a DC biasing voltage. In effect the DC level of the B+ line 116 applied to the VCO 102 is modified in accordance with the variations of the information signal 114 over time. The resultant signal 108 is the information signal 114 shifted in DC by a level equal to level of the DC signal available on the B+ line 116. The signal 108, which controls the bias point of the VCO 102, ends up altering the biasing point of the VCO 102 in response to the information signal 114. The alteration of the biasing point of the VCO 102 results in the output signal 106 being the carrier signal modulated with the information signal. This is due to a known phenomenon referred to as supply sensitivity, that results in the frequency of oscillation of a VCO vary in proportion to variations in the DC power supply level.

This modulation technique provides several benefits. Since this modulation port is completely isolated from the control line, there will not be any poles and zeros introduced by the loop filter. Furthermore, since the tank is not loaded, there is no degradation in Q of the tank. However, the principle advantage with this modulation technique is that the modulation is now an audio issue having no sensitive components. Thus, the summing can be done as an integrated circuit off the high Q substrate used to carry the components of the VCO 102. Additionally the layout would not be as critical as it would be with other modulation methods. The VCO 102 may have any of several designs including but not limited to those incorporating a Colpitts oscillator or a Hartly oscillator, both of which are well known in the art.

Figure 2:
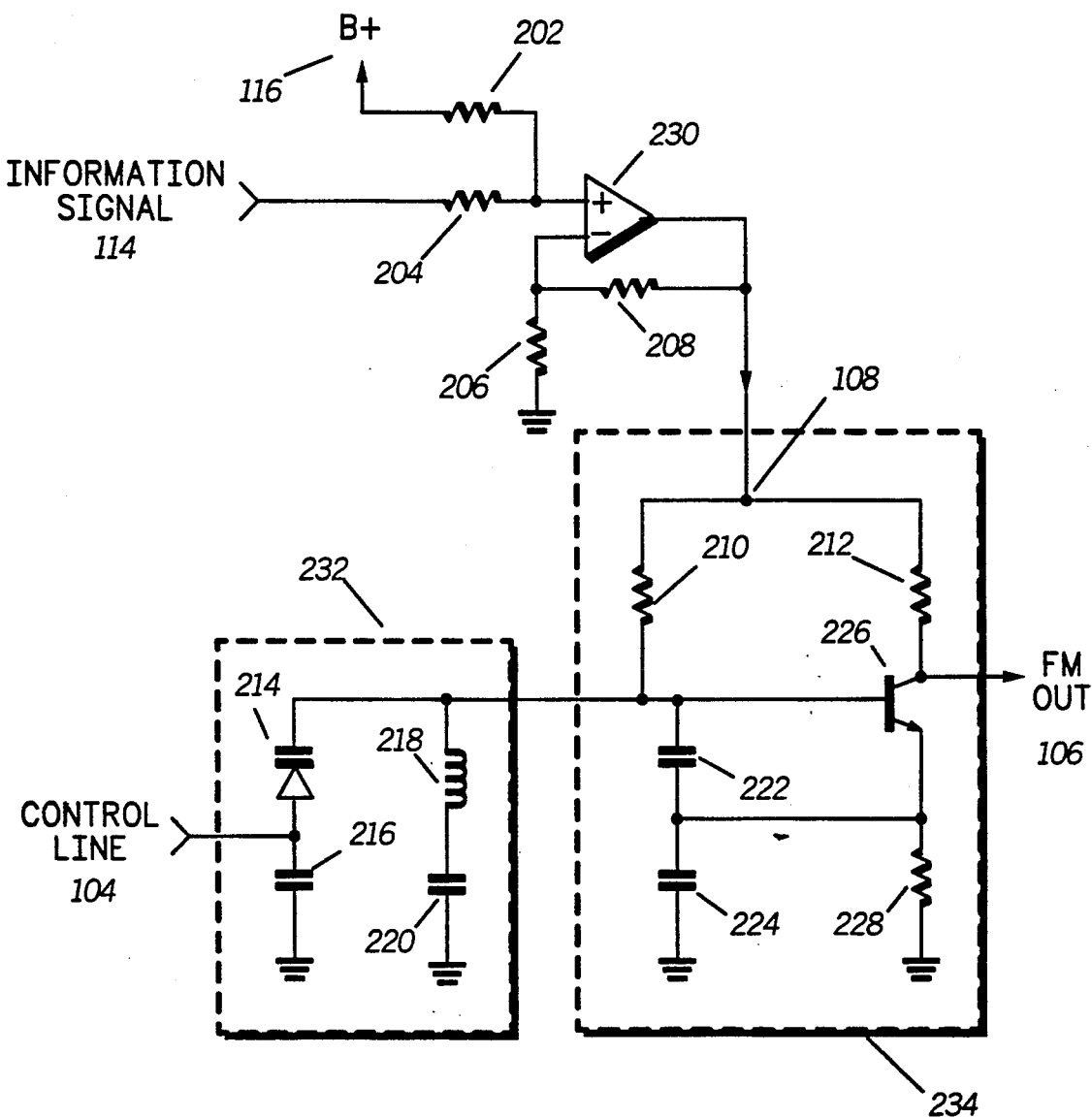
FIG. 2 is a schematic diagram of a voltage controlled oscillator with modulating means in accordance with the principles of the present invention.

Referring to FIG. 2 now, a schematic diagram of the modulation apparatus 100 is shown in accordance with the principles of the present invention. An operational amplifier 230 is used to perform the functions of both the buffer 112 and the summer 110. The information signal 114 is coupled to the non-inverting input of the op. amp. 230, via a resistor 204. The B+ line is coupled to the same non-inverting input of the op. amp. 230 via a resistor 202. Resistors 206 and 208 set the negative feed back to the op. amp. 230. The signal 108 at the output of the op. amp. 230 is the biasing signal to an oscillation amplifier 234 whose active elements is a transistor 226. Resistors 210, 212, and 228 form a biasing network around the transistor 226, that includes temperature compensation performed by resistor 228. The base of the transistor 226 is connected to a tank circuit 232 comprising a varactor 214, inductor 218, and capacitors 216 and 220. The control line input 104 applies a control voltage to the anode of a varactor 214 which is the varying elements of the tank circuit 232. This control voltage changes the varicap voltage of the varactor 214 thus the capacitance shunting the inductor 218, thereby changing the frequency of oscillation of the carrier signal. For more details on the operation of the oscillation amplifier 234 and the tank circuit 232 refer to Modern Communication Circuits by Jack Smith published by McGraw-Hill (incorporated here by reference).

The output signal 106 at the collector of the transistor 226 is the carrier signal frequency modulated with the information signal 114 via its B+ line 116. The Oscillation amplifier 234 and the tank circuit 232 must be carried by a high Q substrate due to their high sensitivity components and the couplings between them. However, the op. amp. 230 and its supporting components can be carried by the main printed circuit board (PCB) of the device. This is due to relatively low sensitivity of these components and their low frequency of operation. Such division in substrate occupation requires less VCO substrate area, thus lower cost, which is highly desirable in high quantity production transmitters. In some transmitters where a digital signal processing (DSP) unit is employed as the brain of the system, it is possible to program a segment of the DSP to perform similar tasks as outlined above.

In summary, a modulator 100 is presented having a control line input 104, an information signal input, a DC voltage biasing input, and an output 106. An information signal 114 is buffered and added to the DC voltage of the B+ line 116 via the op. amp. 230. The resulting signal 108 which is no more than the information signal 114 shifted in DC by the voltage at the DC input line is used to bias a VCO formed by the oscillation amplifier 234 and the tank circuit 232. The FM output 106 of the modulator 100 is the carrier signal generated by the tank circuit 232 and modulated by the signal 108.

Figure 3:
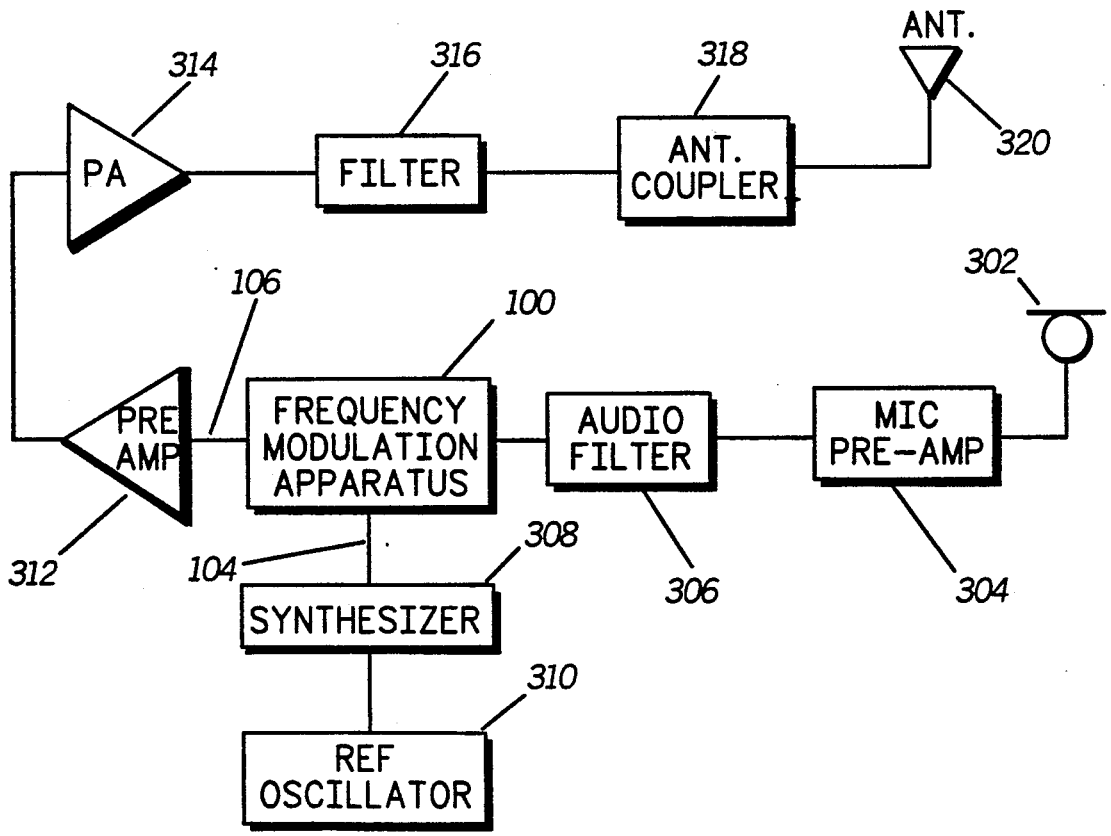
FIG. 3 is a block diagram of a communication device in accordance with the present invention.

Referring to FIG. 3 a block diagram of communication device 300 (such as a FM radio transmitter) is shown in accordance with the present invention. The output of a microphone 302 is amplified by preamplifier 304 whose output is connected to an audio filter 306. The audio filter 306 filters the audio output of the preamplifier 304 to conform with the desired performance characteristics of the communication device 300. The filtered audio signal at the output of the filter 306 is the information signal 114 and is coupled to the Frequency Modulation Apparatus (FMA) 100. The control input line 104 of the FMA 100 is connected to output of a synthesizer 308. A reference oscillator 310 provides the synthesizer 308 with a reference signal. The FMA 100 in conjunction with the synthesizer 308 and the reference oscillator 310 generates a carrier signal at the desired frequency of the communication device 300. This carrier signal, available at the output of the FMA 100, is frequency modulated with the information signal 114. The FMA 100 and the rest of the active elements of the communication device 300 receive a DC power from a DC source such as a battery. The conventional connections to this DC power source are not shown in order to minimize drawing complexity.

The output signal of the FMA 100 is amplified by a preamplifier 312 and further amplified by a power amplifier (PA) 314. The output of the PA 314 is filtered by a filter 316. The filter 316 attenuates harmonics of the carrier signal and other undesirable signals to levels acceptable to regulatory agencies regulating the radio frequency communications in a particular area. The filtered radio frequency signal at the output of the filter 316 is coupled to an antenna coupler 318. The antenna coupler 318 performs impedance matching and signal switching if desired. The output signal of the antenna coupler 318 is coupled to an antenna 320 for transmission.

Those skilled in the art appreciate the availability of other transmitter circuits to achieve similar results. The presentation of this transmitter should be construed only as an example (and not as a limitation) to further clarify the preferred embodiment of the present invention.

What is claimed is:

1. An apparatus for generating a carrier signal modulated with an information signal, comprising:
    voltage controlled oscillator (VCO) means for generating the carrier signal, the VCO means having a control means for controlling the frequency of the carrier signal;
    DC power supply means for providing power to the VCO means; and
    interface means for interfacing the information signal to the DC power supply means for altering the supply power of the VCO in response to the information signal to effect the modulation of the carrier signal.

2. The apparatus of claim 1, wherein the VCO means comprises a Colpitts oscillator.

3. The apparatus of claim 1, wherein the VCO means comprises a Hartley oscillator.

4. The apparatus of claim 1, wherein the interface means comprises a summing circuit.

5. The apparatus of claim 4, wherein the summing circuit includes means for coupling the information signal.

6. The apparatus of claim 5, wherein the coupling means comprises a buffer circuit.

7. The apparatus of claim 4, wherein the summing circuit comprises a field effect transistor (FET).

8. The apparatus of claim 4, wherein the summing circuit comprises a bipolar transistor (BPT).

9. A frequency modulation apparatus, comprising:
    generator means for generating a carrier signal, the generator means having a control line for setting the frequency of the carrier signal;
    power supply means providing a DC voltage for powering the generator means; and
    interface means coupling an information signal to the power supply means for modulating the carrier signal by varying the biasing level of the generator means in response to the information signal.

10. The frequency modulation apparatus of claim 9, wherein the biasing means comprises a DC voltage generated by a battery.

11. The frequency modulation apparatus of claim 9, wherein the interface means comprises a summer means.

12. The frequency modulation apparatus of claim 11, wherein the summer means comprises an operational amplifier.

13. A frequency modulation apparatus for modulating a carrier signal generated by an oscillator with an information signal, the oscillator having a control line for setting the frequency of the carrier signal, the apparatus comprising:

means for supplying a DC power supply signal to the oscillator; and means for summing the information signal to the DC power supply signal for effecting the modulation of the carrier signal by the information signal.

14. The frequency modulation apparatus of claim 13, wherein the means for summing comprises an operational amplifier.

15. A communication device, comprising:

means for transmitting a communication signal, including a frequency modulation apparatus, the frequency modulation apparatus comprising:

generator means for generating a carrier signal the generator means having a control line for setting the frequency of the carrier signal;

power supply means providing a DC voltage for powering the generator means; and interface means coupling an information signal to the power supply means for modulating the carrier signal by varying the biasing level of the generator means in response to the information signal.

* * * * *